United States Patent
Hooper et al.

(10) Patent No.: US 6,500,258 B2
(45) Date of Patent: Dec. 31, 2002

(54) METHOD OF GROWING A SEMICONDUCTOR LAYER

(75) Inventors: Stewart Edward Hooper, Kidlington Oxon (GB); Jonathan Heffernan, Oxford (GB); Jennifer Mary Barnes, Middlesex (GB); Alistair Henderson Kean, Oxfordshire (GB)

(73) Assignee: Sharp Kabushiki Kaisha, Osaka (JP)

( * ) Notice: Subject to any disclaimer, the term of this patent is extended or adjusted under 35 U.S.C. 154(b) by 45 days.

(21) Appl. No.: 09/884,881

(22) Filed: Jun. 18, 2001

(65) Prior Publication Data

US 2002/0015866 A1 Feb. 7, 2002

(30) Foreign Application Priority Data

Jun. 17, 2000 (GB) .............................................. 0014952

(51) Int. Cl.⁷ .............................................. C30B 23/02
(52) U.S. Cl. ........................ 117/105; 117/89; 117/94; 117/101; 117/106; 117/952
(58) Field of Search .............................. 117/105, 89, 94, 117/101, 106, 952

(56) References Cited

U.S. PATENT DOCUMENTS 6,146,458 A * 11/2000 Hooper et al. ............... 117/106
6,270,574 B1 * 8/2001 Hooper ....................... 117/105
6,391,748 B1 * 5/2002 Temkin et al. ............... 438/478
6,440,214 B1 * 8/2002 Hooper et al. ................ 117/94

FOREIGN PATENT DOCUMENTS

| EP | 0 864 672 A2 | 9/1998 |
| JP | 2000281499 | * 10/2000 |
| WO | 97/13891 | 4/1997 |

OTHER PUBLICATIONS

Fu et al. "Theoretical study of GaN molecular beam epitaxy growth using ammonia: A rate equation approach", J. Vacuum Science Technology B vol. 18(3) pp. 1467–1471 May/Jun. 2000.*

British Search Report, Application No. GB 0014952.6, dated Nov. 30, 2000.

* cited by examiner

Primary Examiner—Robert Kunemund
(74) Attorney, Agent, or Firm—Renner, Otto, Boisselle & Sklar

(57) ABSTRACT

This invention relates to a method of growing a nitride semiconductor layer by molecular beam epitaxy comprising the steps of: a) heating a GaN substrate (S) disposed in a growth chamber (10) to a substrate temperature of at least 850° C.; and b) growing a nitride semiconductor layer on the GaN substrate by molecular beam epitaxy at a substrate temperature of at least 850° C., ammonia gas being supplied to the growth chamber (10) during the growth of the nitride semiconductor layer; wherein the method comprises the further step of commencing the supply ammonia gas to the growth chamber during step (a), before the substrate temperature has reached 800° C.

13 Claims, 4 Drawing Sheets

METHOD OF GROWING A SEMICONDUCTOR LAYER

BACKGROUND OF THE INVENTION

1. Field of the Invention

This invention relates to a molecular beam epitaxy (MBE) method for the epitaxial growth of Group III nitride semiconductor materials such as, for example, GaN or other members of the (Ga, Al, In)N material family.

2. Description of the Related Art

The epitaxial growth of Group III nitride semiconductor materials on a substrate can be effected by molecular beam epitaxy (MBE) or by chemical vapour deposition (CVD) which is sometimes known as Vapour Phase Epitaxy (VPE).

CVD (or VPE) takes place in an apparatus which is commonly at atmospheric pressure but sometimes at a slightly reduced pressure of typically about 10 kPa. Ammonia and the species providing one or more Group III elements to be used in epitaxial growth are supplied substantially parallel to the surface of a substrate upon which epitaxial growth is to take place, thus forming a boundary layer adjacent to and flowing across the substrate surface. It is in this gaseous boundary layer that decomposition to form nitrogen and the other elements to be epitaxially deposited takes place so that the epitaxial growth is driven by gas phase equilibria.

In contrast to CVD, MBE in carried out in a high vacuum environment. In the case of MBE as applied to the GaN system, an ultra-high vacuum (UHV) environment, typically around $1 \times 10^{-3}$ Pa, is used. Ammonia or another nitrogen precursor is supplied to the MBE chamber by means of a supply conduit and a species providing gallium and, possibly, indium and/or aluminium are supplied from appropriate sources within heated effusion cells fitted with controllable shutters to control the amounts of the species supplied into the MBE chamber during the epitaxial growth period. The shutter-control outlets from the effusion cells and the nitrogen supply conduit face the surface of the substrate upon which epitaxial growth is to take place. The ammonia and the species supplied from the effusion cells travel across the MBE chamber and reach the substrate where epitaxial growth takes place in a manner which is driven by the deposition kinetics.

At present, the majority of growth of high quality GaN layers is carried out using the metal-organic chemical vapour deposition (MOCVD) process. The MOCVD process allows good control of the growth of the nucleation layer and of the annealing of the nucleation layer. Furthermore, the MOCVD process allows growth to occur at a V/III ratio well in excess of 1000:1. The V/III ratio is the molar ratio of the group V element to the Group III element during the growth process. A high V/III ratio is preferable, since this allows a higher substrate temperature to be used which in turn leads to a higher quality GaN layer.

At present, growing high quality GaN layers by MBE is more difficult than growing such layers by MOCVD. The principal difficulty is in supplying sufficient nitrogen during the growth process; it is difficult to obtain a V/III ratio of 10:1 or greater. The two commonly used sources of nitrogen In the MBE growth of nitride layers are plasma excited molecular nitrogen or ammonia.

GaN has a lattice constant of around 0.45 nm. There is a lack of suitable substrates that, are lattice-matched to GaN, so GaN is generally grown onto either a sapphire substrate or a silicon carbide substrate. There is a large mis-match between the lattice constant of GaN and the lattice constant of sapphire or silicon carbide, and there is also a considerable difference in thermal properties, such as the thermal expansion coefficient, between the GaN layer and the substrate. It is therefore necessary to provide a thin initial nucleation layer on the substrate in order to grow a high quality GaN layer on sapphire or silicon carbide.

I. Akasaki and I. Amano report, in "Japanese Journal of Applied Physics" Vol. 36, pp5393–5408 (1997), that a thin AlN layer, deposited at a low growth temperature, can be used as a nucleation layer to promote the growth of a GaN layer by metal organic chemical vapour deposition (MOCVD) process on a sapphire or silicon carbide substrate. U.S. Pat. No. 5,290,393 discloses the use of a GaN nucleation layer, again deposited at a low growth temperature, for promoting the growth of a GaN layer using MOCVD.

U.S. Pat. No. 5,385,862 discloses a further method of growing a single crystal GaN film on a sapphire substrate using MBE. In this method, a nucleation layer is grown on the substrate at a growth temperature of 400° C. or lower. Furthermore, the V/III ratio of this method is very small, being less than 5:1, so that the subsequent GaN layer is restricted to a growth temperature of lower than 900° C. GaN layers grown by this method have electron mobilities at room temperature of less than 100 $cm^2V^{-1}s^{-1}$.

Further prior art methods of growing GaN on a sapphire or silicon carbide substrate are reported by Z. Yang et al in "Applied Physics Letters" Vol. 67, pp1686–1688 (1995), and by N. Grandjean et al in "Applied Physics Letters" Vol. 71, p240–242 (1997). In both of these methods a GaN nucleation layer is initially grown on the substrate, after which the GaN layer is grown.

Although the provision of a nucleation layer does reduce the effect of the lattice and thermal mis-match between a GaN layer and a sapphire or silicon carbide substrate, the effects of the lattice and thermal mis-match are not eliminated completely. Moreover it is difficult and time-consuming to optimise the nucleation layer so as to obtain the highest possible quality GaN, and the step of growing the nucleation layer adds to the complexity of the growth process. It is accordingly desirable to use a GaN substrate for the growth of an epitaxial GaN layer.

A GaN substrate for use in the epitaxial growth of GaN can have two possible forms—a GaN substrate can be a "free-standing" substrate or a "template" substrate. A free-standing GaN substrate consists solely of GaN, and is formed by, for example, a GaN crystal. A template GaN substrate consists of a thick epitaxial layer of GaN grown on a base substrate of, for example, sapphire or silicon carbide. The thick epitaxial layer is grown on the base substrate by any suitable technique, such as metal-organic vapour phase epitaxy (MOVPE) or hydride vapour phase epitaxy (HVPE). Compared with the nucleation layers mentioned above, the epitaxial layer of a GaN template substrate is much thicker than a nucleation layer, for example having a thickness in the range 5 μm–100 μm.

M. Kamp et al report, in "Mat Res Soc Proc", Vol. 449, p161 (1997), the growth of a GaN layer by MBE on a free-standing GaN substrate. They obtain good quality GaN, having a photoluminescence (PL) linewidth with a FWHM of 0.5 meV and a dislocation density in the range $10^2$ to $10^3$ $cm^{-2}$. However, Kamp et al achieve a growth temperature of only 750° C.

WO 97/13891 discloses a method of epitaxial growth of a nitride semiconductor layer (GaN or Ga(Al,In)N) on a single crystal GaN or Ga(Al,In)$_N$. This document is primarily directed to the way in which the substrate is produced, and teaches disposing a solution of Ga or Ga,Al,In in a heated nitrogen atmosphere so as to grow a bulk crystal of GaN or Ga(Al,In)N.

Once the bulk crystal has been grown, it is used as the substrate in an epitaxial growth process. The document speculates that it would be possible to grow an epitaxial layer on the substrate by MBE in the temperature range 500–900° C. however, the document contains no teaching as to how an MBE growth temperature for GaN of 900° C. could be achieved.

The growth of GaN on a GaN template substrate has been reported by, for example, W. C. Hughes et al in "J. Vac. Sci. Technol B" Vol. 13, p1571 (1995). In this report, GaN is grown by MBE with plasma excited molecular nitrogen used as the source of nitrogen for the MBE growth process. Other reports of the MBE growth of GaN on a GaN template substrate have been made by E. J., Tarsa et al in "Journal of Applied-Physics", Vol. 82, p5472 (1997); by H. Sakai et al in "Japanese Journal of Applied Physics", Vol. 34, L1429 (1995); by M. A. Sanchez-Garcia at al in "Phys. Stat. Sol.(a)", Vol. 176, p447 (1999); by S. Kurai et al in "Phys. Stat. Sol.(a)", Vol. 176, p459 (1999): and by A. Rinta-Moykky et al in "Phys. Stat. Sol.(a)", Vol. 176, p465 (1999). In each of these reports, plasma excited molecular nitrogen was used as the source of nitrogen for the MBE growth process.

SUMMARY OF THE INVENTION

A first aspect of the present invention provides a method of growing a nitride semiconductor layer by molecular beam epitaxy (MBE) comprising the steps of: heating A GaN substrate disposed in a growth chamber to a substrate temperature of at least 850° C.; and growing a nitride semiconductor layer on the GaN substrate by molecular beam epitaxy at a substrate temperature of at least 850° C., ammonia gas being supplied to the growth chamber during the growth of the nitride semiconductor layer; wherein the method comprises the further step of commencing the supply ammonia gas to the growth chamber during step (a), before the substrate temperature reaches 800° C. The present invention thus provides a method of growing a high quality layer of a nitride semiconductor by MBE. Commencing the supply of ammonia gas to the substrate during the step of heating the substrate, before the substrate temperature reached 800° C., prevents thermal decomposition of the substrate (which would otherwise occur at substrate temperatures above 800° C.). The substrate temperature during the growth of the nitride semiconductor layer may be in the range 850° C. to 1050° C.

The substrate temperature during the growth of the nitride semiconductor layer may be in the range 850° C. to 1050° C.

The method may comprise the further step of reducing the substrate temperature to a temperature below 800° C. after the nitride semiconductor layer has been grown while maintaining the supply of ammonia gas to the growth chamber.

The method may comprise the further step of maintaining the substrate at a substrate temperature greater than 850° C. for a predetermined time before growing the nitride semiconductor layer, ammonia gas being supplied to the growth chamber during the predetermined time. This allows the substrate to be out-gassed, thereby removing impurities from the substrate before the start of the growth process.

The substrate temperature may be maintained in the range 850° C. to 1050° C. during the predetermined time.

The predetermined time may be 30 minutes or less.

Ammonia gas may be supplied to the growth chamber during the entire duration of step (a).

The nitride semiconductor layer may be a GaN layer. The substrate may be a freestanding GaN substrate, or it may alternatively be a GaN template substrate. The use of a GaN substrate eliminates the lattice and thermal mis-match that occurs when, for example, a GaN layer is grown on a sapphire or silicon carbide substrate.

The method may comprise the further step of growing at least one (Al,Ga,In)N semiconductor layer on the nitride semiconductor layer. Thus, the present invention enables a high-quality (Al,Ga,In)N electronic or opto-electronic device to be manufactured.

A second aspect of the invention provides a nitride semiconductor layer grown by a method as defined above.

A third aspect of the present invention defines a semiconductor device comprising a nitride semiconductor layer as defined above.

Preferred embodiments of the present invention will now be described by way of an illustrative example with reference to the accompanying figures which:

DESCRIPTION OF THE PREFERRED EMBODIMENTS

Figure 1:
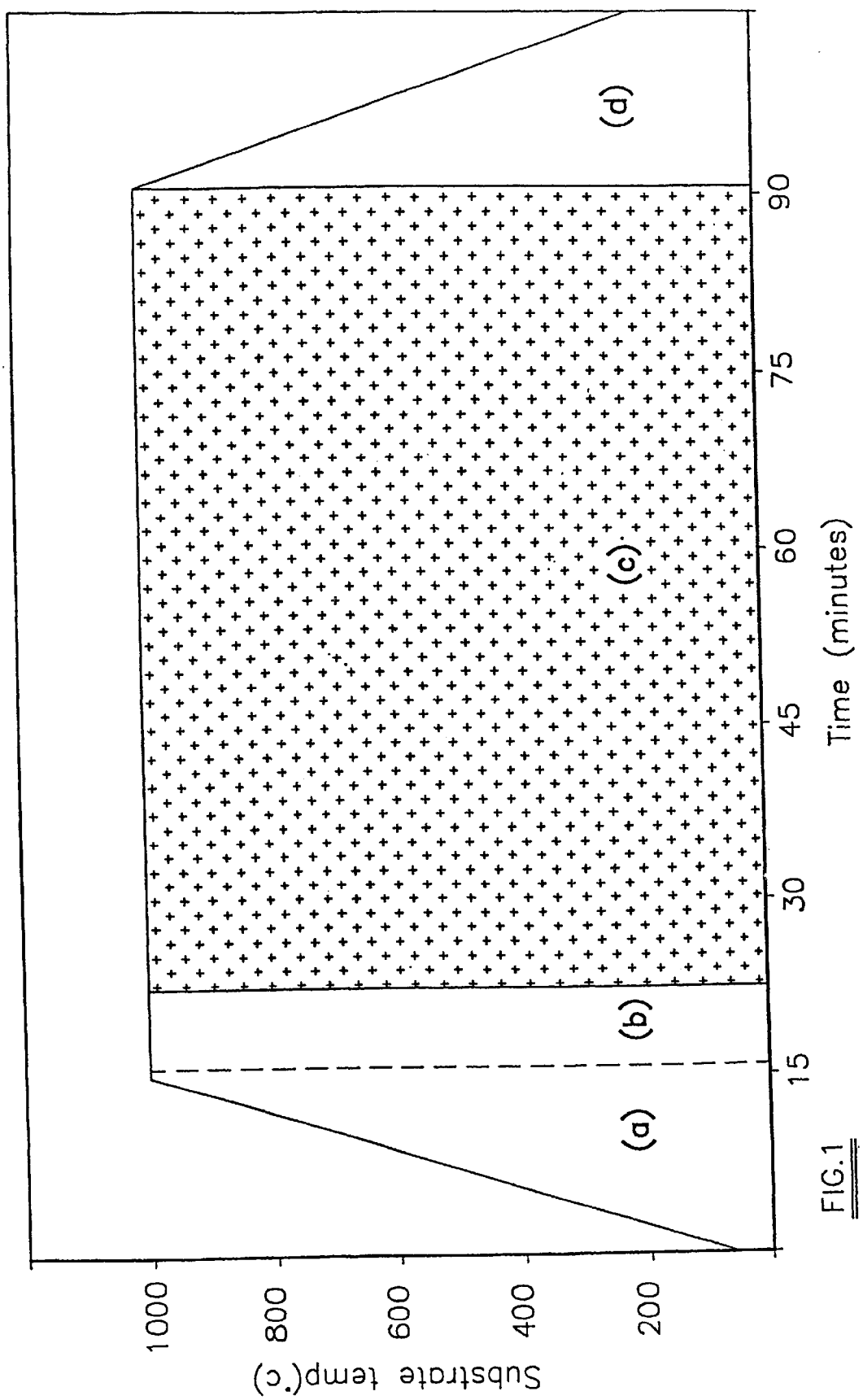
FIG. 1 is a schematic illustration of a substrate temperature against time during a growth process according to one embodiment of the present invention.

One example of a growth method according to the present invention, illustrating the growth of a GaN layer will now be described.

A suitable substrate is prepared in any conventional manner, and in introduced into the growth chamber of a MBE apparatus. The substrate is preferably a free-standing GaN substrate, but a GaN template substrate could also be used. As explained above GaN template substrate consists of a relatively thick epitaxial GaN layer (for example having a thickness in the range 5 $\mu$m to 100 $\mu$m) grown on a base substrate. The base substrate may be, for example sapphire, silicon carbide, silicon, zinc oxide, or magnesium oxide.

in the method of the present invention, the MBE growth of a nitride semiconductor layer on a GaN substrate is carried out at a temperature of 850° C. or greater. It is possible to achieve such a high growth temperature because the present invention can achieve a V/III ratio of up to approximately 5000.

In practice, the constraints of the MBE equipment used have been found to limit the growth temperature obtainable to a maximum of approximately 1,050° C. Although a method of the present invention could in principle obtain a higher growth temperature than this, a maximum growth temperature of 1,050° C. is acceptable since it corresponds to the maximum growth temperature obtainable by an MOCVD process for growing a nitride semiconductor layer.

in the method of the invention, the substrate is initially heated up to a pre-determined temperature of at least 850° C. As noted above, the maximum temperature achievable in practice is likely to be in the order of 1,050° C. This is shown as step (a) in FIG. 1.

The rate at which the temperature of the substrate is increased should not be so great that an uneven temperature distribution might occur in the substrate, since this would set up thermal stresses in the substrate. A temperature ramp rate in the range of 10–120° C. per minute has been found to be suitable.

GaN tends to decompose when it is heated. The temperature at which GaN starts to decompose is pressure-dependent, and under vacuum conditions the temperature at which decomposition starts is in the range 750° C. to 800° C. This decomposition can be prevented by supplying nitrogen gas or ammonia gas to the growth chamber so that an overpressure of nitrogen gas or ammonia gas exists at the surface of the GaN substrate. According to the invention, therefore, ammonia gas is supplied to the growth chamber so as to establish and maintain an overpressure of nitrogen gas or ammonia gas at the surface of the GaN substrate at temperatures where the substrate is liable to decompose, and thus prevent thermal decomposition of the substrate. This is achieved by commencing supplying ammonia gas to the growth chamber during step (a) of heating the substrate, before the substrate temperature has reached 800° C.

In principle ammonia gas does not need to be supplied to the growth chamber when the substrate temperature is substantially below 800° C., since decomposition of the substrate does not occur at these temperatures. In practice, however, it may be more convenient to supply the ammonia gas to the growth chamber for the entire duration of the heating step. In a preferred embodiment of the invention therefore, ammonia gas is supplied to the growth chamber for the entire duration of the heating step (a), so that an overpressure of ammonia gas exists at the surface of the substrate for the entire duration of the heating step. Alternatively, the supply of ammonia gas to the growth chamber may be started during the heating step but at a substrate temperature lower than 800° C. For example, the supply of ammonia gas to the growth chamber may be started before the substrate temperature reaches the lower end of the temperature range in which the onset of decomposition occurs (i.e., before the substrate temperature reaches 750° C.) or it may be started at a substrate temperature below this to provide a margin of error.

Once the substrate temperature has reached the desired value, the substrate is maintained at this temperature to bake the substrate, to remove contaminants from the substrate. This is step (b) in FIG. 1. In FIG. 1 the baking step has a duration of slightly over 5 minutes, but the duration of the baking step may be up to 30 minutes.

The supply of ammonia gas to the growth chamber is maintained during the baking step, to prevent the thermal decomposition of the GaN substrate. Supplying ammonia gas also promotes the removal of contaminants from the surface of the substrate during the baking step, and achieves nitridation of the surface of the substrate.

Once the thermal baking step has been completed, a GaN layer is grown by molecular beam epitaxy onto the substrate. As noted above, ammonia gas is already being supplied to the substrate, and this will act as a source of nitrogen for the MBE growth process. Thus, in order to start the MBE growth, it is necessary only to provide a source of gallium. Once gallium is supplied to the growth chamber, MBE growth of a GaN film on the substrate will occur.

In this embodiment, gallium for the MBE growth process is supplied by a beam of elemental gallium having a beam equivalent pressure in the range $1 \times 10^{-8}$ to $1 \times 10^{-5}$ mbar. A suitable beam equivalent pressure for the supply of ammonia gas during the growth process is between $1 \times 10^{-4}$ and $1 \times 10^{-2}$ mbar. The same beam equivalent pressure of ammonia can be used in the baking step as in the growth step, although it is not essential to use the same beam equivalent pressure in the baking and growth steps.

The MBE growth step is step (c) in FIG. 1.

Once the GaN layer has been grown to a desired thickness, the MBE growth process is stopped by stopping the supply of elemental gallium to the growth chamber. The substrate is then cooled, and this is shown as step (d) in FIG. 1. The supply of ammonia gas to the substrate is continued while the substrate temperature is reduced in step (d), at least until the temperature of the substrate has fallen to below 800° C., to prevent the thermal decomposition of the GaN. In practice it may be more convenient to supply ammonia gas to the growth chamber for the entire duration of the cool-down step (d). Alternatively, the supply of ammonia gas to the growth chamber could be discontinued during the cool-down step, for example when the substrate temperature has fallen to 750° C. or to a lower temperature.

The temperature ramp rate during the step of cooling the substrate must again be chosen to prevent setting up any undue thermal stresses within the substrate, or between the substrate and the GaN layer. A temperature ramp rate in the range of 10–120° C. per minute has again been found to be suitable.

The V/III molar ratio during the growth of the GaN layer is preferably greater than 10:1, and is preferably less than 5,000:1. Although a V/III molar ratio greater than 5,000:1 could in principle be used, it has been found that the growth rate is slow if the growth is carried out at a V/III molar ratio significantly above 5,000:1. It appears that a V/III molar ratio of around 5,000:1 is the maximum that can be achieved while still providing a growth rate in the range of approximately 0.5 to 1.0 μm/hour. This high V/III molar ratio allows the GaN layer to be grown at a temperature of 850° C. or greater, which is a significantly higher temperature than used in prior art MBE growth of GaN. Because the present invention enables a higher growth temperature to be used, the quality of the resultant GaN layer is improved.

Figure 2:
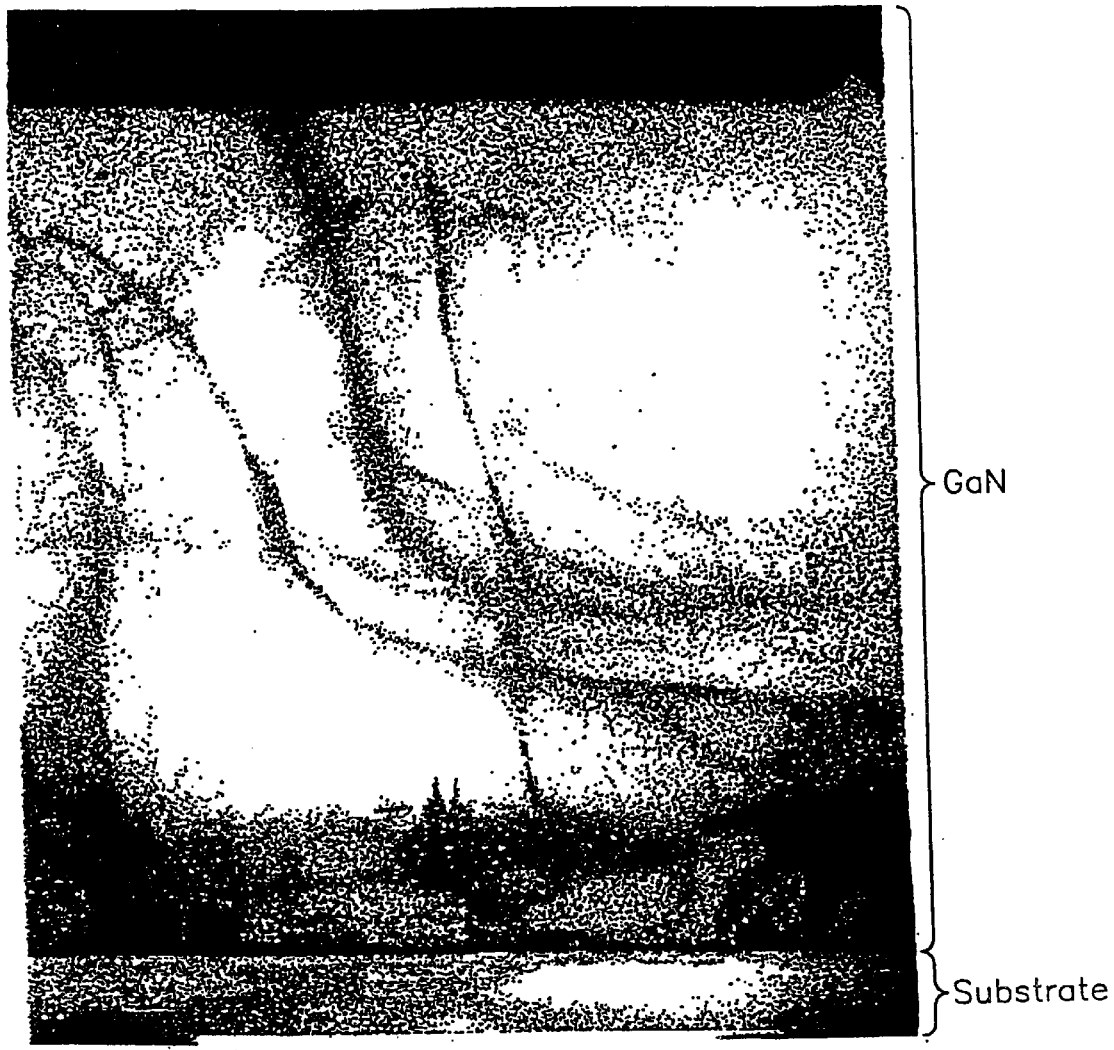
FIG. 2 is a transmission electron micrograph showing the cross section of a layer of GaN grown on a GaN template substrate by a method of the present invention.

FIG. 2 shows the transmission electron microscope image of the cross-section of a GaN layer grown using a method of the present invention. FIG. 2 shows the cross-section of a non-intentionally doped GaN layer that has a thickness of 3 μm, and that was grown onto a GaN template substrate. The density of threading dislocations in the GaN layer is approximately $1 \times 10^8$ cm$^{-2}$. This compares with a typical density of threading dislocations in GaN grown by MOCVD of approximately $10^8$ to $10^{10}$ cm$^{-2}$, as reported by Akasaki et al (above).

The density of threading dislocations in the material of FIG. 2 is significantly lower than in samples of GaN grown by a conventional MBE. For example, Grandjean et al (above) report a threading dislocation density in their MBE grown GaN of greater than $5 \times 10^9$ cm$^{-2}$.

The free carrier concentration and the electron mobility of GaN layers grown using a method of the present invention have been measured using room temperature Hall Effect Measurements. It is found that a non-intentionally doped GaN film grown by a MBE method of the invention typically has an n-type free carrier concentration of less than $3 \times 10^{16}$ cm$^{-3}$ and an electron mobility of greater than 500 cm$^2$ $V^{-1}s^{-1}$. These results compare favourably with the carrier concentration and electron mobility achieved in typical GaN layers grown using a conventional MOCVD growth method.

Figure 3:
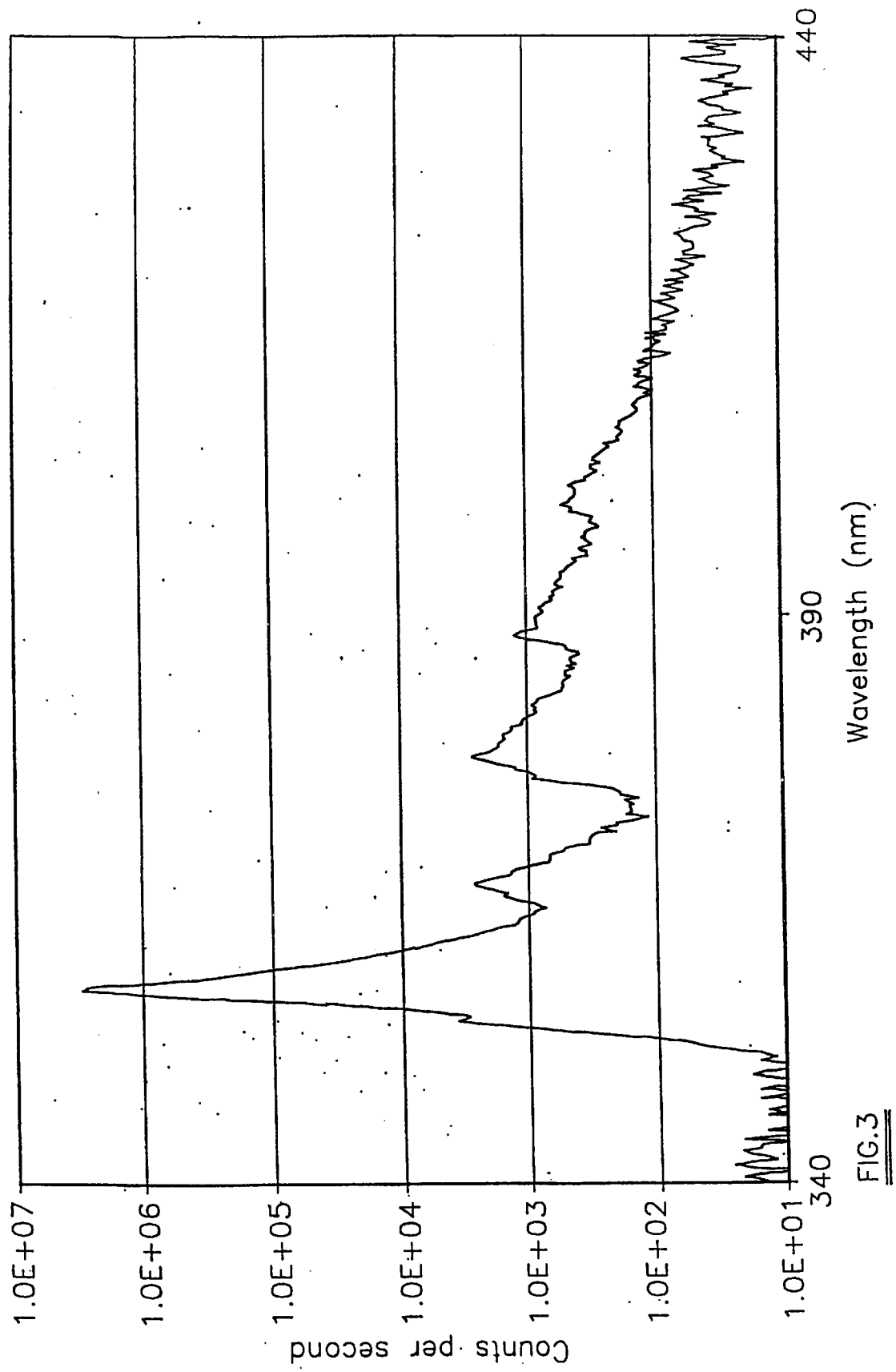
FIG. 3 shows a photoluminescence spectrum of a non-intentionally doped GaN layer grown on a GaN template substrate by a method of the present invention.

FIG. 3 shows a photoluminescence (PL) spectrum of a layer of non-intentionally doped GaN grown using a MBE growth process of the present invention. It will be seen that the spectrum is dominated by near band edge emission and contains a free exciton peak. The PL spectrum of FIG. 3 is indicative of a high quality GaN layer.

The surface of a GaN layer grown by the method of the present invention has been found to be very smooth. The roughness may be measured using an atomic force microscope, and this shows that the RMS (root mean square) roughness of the surface is of the order of 1 nm.

The use of a high V/III ratio during the growth process of the present invention allows a nitride semiconductor layer to be grown at temperatures well above those used in prior art MBE methods. This leads to improved material quality. The MBE growth process of the present invention requires at least one thousand times less ammonia gas than does a conventional MOCVD process.

The present invention requires a MBE growth apparatus that can achieve a V/III ratio of more than 10:1 during the growth process. Such high V/III ratios can be achieved, for example, in a MBE growth apparatus in which ammonia gas is introduced into the growth chamber through a conduit whose outlet end is placed as close to the substrate as possible without radiative heat from the substrate causing excessive local heating of the outlet of the supply conduit. The elemental gallium is introduced into the growth chamber using a conventional effusion cell. Further effusion cells can be used to supply aluminium and/or indium and/or a elemental dopant for incorporation into the epitaxial growth material as necessary.

Figure 4:
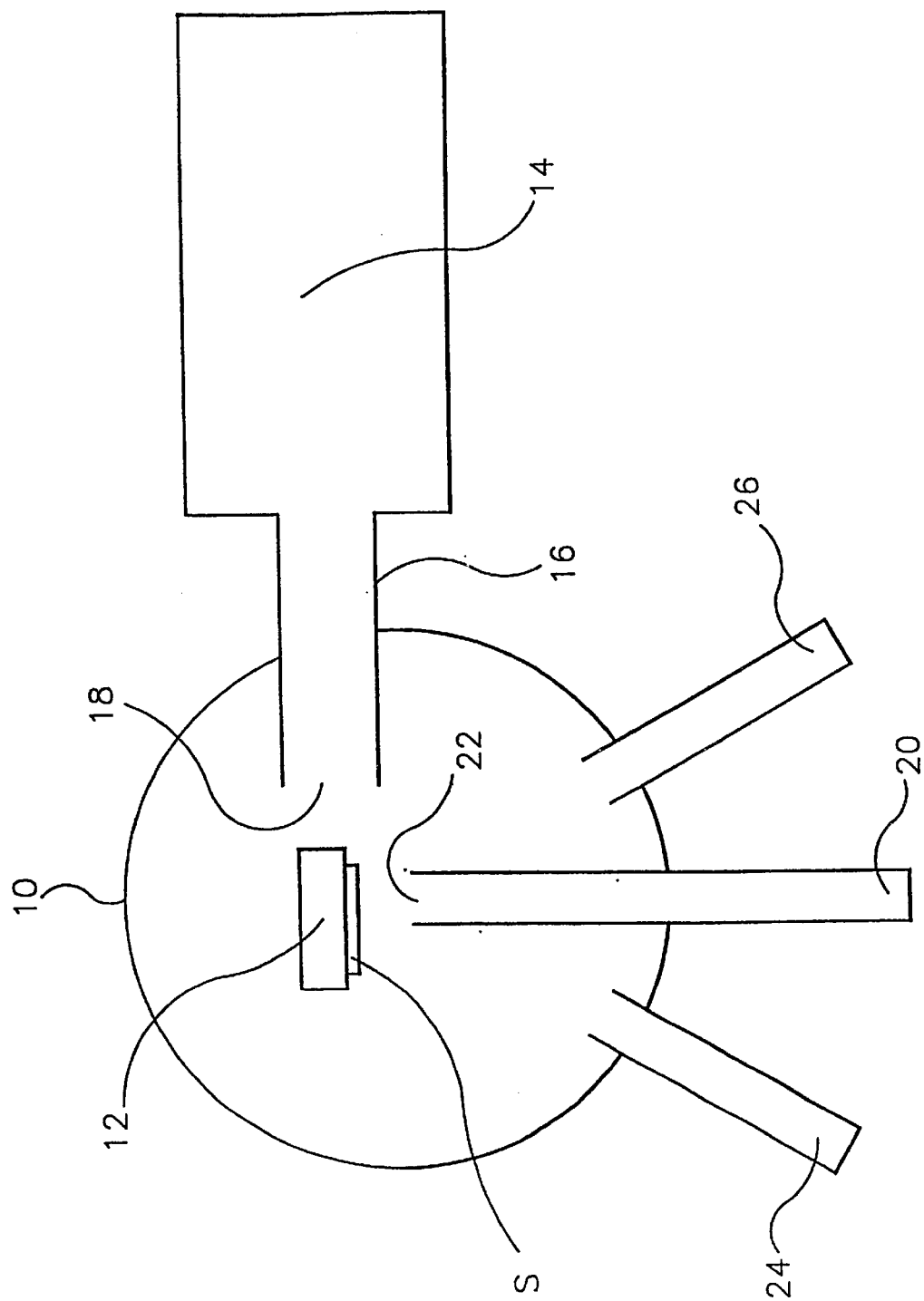
FIG. 4 is a schematic diagram of an example of an MBE apparatus suitable for putting the present invention into effect.

FIG. 4 is a schematic view of an apparatus suitable for the growth of a nitride semiconductor material by molecular beam epitaxy according to a method of the present invention. The apparatus comprises a growth chamber 10 in which is disposed a heated support 12 arranged to support and heat a substrate S. The growth chamber 10 is connected with an ultra-high vacuum pump 14 via an exhaust conduit 16 which extends into the growth chamber 10. The inner end of the exhaust conduit 16 defines a vacuum outlet 18 of the growth chamber 10. The vacuum outlet 18 is disposed adjacent to the substrate support 12.

The growth chamber 10 is further provided with a first supply conduit 20 which extends into the growth chamber so that an outlet 22 of the first supply conduit 20 is adjacent to and faces the surface of the substrate S upon which epitaxial growth is to take place. The first supply conduit 20 can be adjustably mounted relative to the chamber so that the relatively small distance between the outlet 22 of the first supply conduit 20 and the epitaxial growth surface of the substrate S can be varied during the epitaxial growth process. The longitudinal axis of the first supply conduit 20 is substantially perpendicular to the plane of epitaxial growth.

The first supply conduit 20 is used to supply ammonia which is the precursor of the nitrogen required in the epitaxial growth process. Because the outlet 22 of the first supply conduit 20 is positioned relatively close to the substrate S, a relatively high ammonia vapour pressure is localised at the surface of the epitaxially growing material while still enabling an ultra-high vacuum environment within the growth chamber 10 to be achieved by the pump 14. The high ammonia vapour pressure enables a high V/III ratio to be realised during the growth process.

The apparatus further comprises independently operable, shutter-controlled effusion cells 24, 26 (two such cells are shown in FIG. 4) which contain sources of elemental gallium and another element (for example, aluminium, indium or a dopant) which may be required during the epitaxial growth process. The effusion cells 24 and 26 are conventionally positioned and define second and further supply conduits respectively.

A MBE apparatus of the type described above is described in European Patent Application No. 98301842.5, the contents of which are hereby incorporated by reference. It should be noted, however, that the present invention is not limited to a MBE apparatus of the type described in European Patent Application No. 98301842.5/0 864 672, but can be carried out in any MBE growth apparatus that can provide the required V/III ratio.

Although the embodiment described above relates to the growth of a GaN layer, the invention is not limited to this, but can be used for the growth of other nitride semiconductor layers such as, for example, $Ga_xAl_{1-x}N$, $Ga_yIn_{1-y}N$ or $Ga_xAl_yIn_{1-x-y}N$.

in the embodiment described above, the GaN layer that is grown is not intentionally doped. It is, however, possible to dope the GaN layer by introducing a suitable dopant during the MBE growth process, in a manner which is well known per se. Suitable dopants include, for example, silicon, tin, germanium, calcium, carbon, beryllium and indium.

Once the nitride semiconductor layer has been grown by a molecular beam epitaxy method of the present invention, further semiconductor layers can be grown so as to produce an (Al,Ga,In)N electronic or opto electronic device. For example, a GaN layer grown by a method of the present invention can be used as the basis for a laser device emitting light in the wavelength range 380–450 nm

What is claimed is:

1. A method of growing a nitride semiconductor layer by molecular beam epitaxy comprising the steps of:
    a) heating a GaN Substrate (S) disposed in a growth chamber (10) to a substrate temperature of at least 850° C.; and
    b) growing a nitride semiconductor layer on the GaN substrate by molecular beam epitaxy at a substrate temperature of at least 850° C., ammonia gas being supplied to the growth chamber (10) during the growth of the nitride semiconductor layer;
    wherein the method comprises the further step of commencing the supply ammonia gas to the growth chamber during step (a), before the substrate temperature has reached 800° C.

2. A method as claimed in claim 1, wherein the substrate temperature during the growth of the nitride semiconductor layer is in the range 850° C. to 1050° C.

3. A method an claimed in claim 1 and comprising the further step of reducing the substrate temperature to a temperature below 800° C. after the nitride semiconductor layer has been grown while maintaining the supply of ammonia gas to the growth chamber.

4. A method as claimed in claim 1, and comprising the further step of maintaining the substrate at a substrate temperature greater than 850° C. for a predetermined time before growing the nitride semiconductor layer, ammonia gas being supplied to the growth chamber during the predetermined time.

5. A method an claimed in claim 4 wherein the substrate temperature is maintained in the range 850° C. to 1050° C. during the predetermined time.

6. A method as claimed in claim 4 wherein the predetermined time is 30 minutes or less.

7. A method as claimed in claim 1 wherein ammonia gas is supplied to the growth chamber during the entire duration of step (a).

8. A method as claimed in claim 1 wherein the nitride semiconductor layer is a GaN layer.

9. A method as claimed in claim 1 wherein the substrate is a free-standing GaN substrate.

10. A method as claimed in claim 1 wherein the substrate is a template GaN substrate.

11. A method as claimed in claim 1 and comprising the further step of growing at least one (Al,Ga,In)N semiconductor layer on the nitride semiconductor layer.

12. A nitride semiconductor layer grown by a method defined in claim 1.

13. A semiconductor device comprising a nitride semiconductor layer as defined in claim 12.

* * * * *